United States Patent
Hsieh et al.

(10) Patent No.: US 7,665,319 B2
(45) Date of Patent: Feb. 23, 2010

(54) FAN CONTROL DEVICE AND METHOD

(75) Inventors: Tsung-Jung Hsieh, Taoyuan Hsien (TW); Yu-Liang Lin, Taoyuan Hsien (TW); Yueh-Lung Huang, Taoyuan Hsien (TW); Ming-Shi Tsai, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 835 days.

(21) Appl. No.: 11/283,749

(22) Filed: Nov. 22, 2005

(65) Prior Publication Data
US 2006/0236706 A1    Oct. 26, 2006

(30) Foreign Application Priority Data
Apr. 22, 2005    (TW) ............................. 94112965 A

(51) Int. Cl.
*F25D 17/00* (2006.01)
*G05B 11/28* (2006.01)
*H02P 23/00* (2006.01)
*H05K 7/20* (2006.01)
*G06F 1/20* (2006.01)

(52) U.S. Cl. .................. 62/178; 318/599; 318/811; 361/695; 361/679.46

(58) Field of Classification Search ............ 62/178, 62/186; 236/49.3, DIG. 9; 318/471, 472, 318/599, 811
See application file for complete search history.

(56) References Cited

U.S. PATENT DOCUMENTS 7,064,511 B2 * 6/2006 Marando et al. ....... 318/400.08
2004/0040318 A1 * 3/2004 Getz et al. .................... 62/132

* cited by examiner

*Primary Examiner*—Chen-Wen Jiang
(74) *Attorney, Agent, or Firm*—Birch, Stewart, Kolasch & Birch, LLP

(57) ABSTRACT

A fan control device receives a target revolution signal to control a rotation speed of a fan. The device includes a temperature measuring module, a revolution modulating module and a driving module. The temperature measuring module generates a temperature value according to an ambient temperature of the fan. The revolution modulating module is electrically connected with the temperature measuring module, receives the temperature value, and generates a control signal according to the temperature value and the target revolution signal. The driving module is electrically connected with the revolution modulating module, and generates a driving signal to drive the fan according to the control signal. In addition, a fan control method, which is applied to the fan control device, is also provided.

17 Claims, 13 Drawing Sheets

FAN CONTROL DEVICE AND METHOD

BACKGROUND OF THE INVENTION

1. Field of Invention

The invention relates to a fan control device and a fan control method.

2. Related Art

Fans are disposed in various types of electrical devices to facilitate the heat dissipation in these devices. A conventional fan control device can properly set the rotation speed of the fan at a full speed, a low speed, and a medium speed between the full speed and the low speed according to the ambient temperature of the fan.

Referring to FIG. 1, a conventional fan control device 1 includes a temperature sensor 11 and a driving chip 12. The temperature sensor 11 measures an ambient temperature and generates a measurement value 111. The driving chip 12 generates a driving signal 122 according to the measurement value 111 or a threshold revolution signal 121. A fan 2 receives the driving signal 122 and works according to the driving signal 122. The driving signal 122 is a pulse width modulation signal, and the threshold revolution signal 121 is a constant voltage level, so the rotation speed of the fan 2 can be adjusted according to the voltage value of the driving signal 122 or the width ratio between the voltage pulses.

The temperature sensor 11 can be a thermistor, as shown in FIG. 2. The voltage of the measurement value 111 generated by the temperature sensor 11 gets lower as the ambient temperature gets higher.

As shown in FIGS. 1 and 3, the rotation speed of the fan 2 is adjusted according to the voltage value of the driving signal 122 or the width ratio between the voltage pulses, and the driving signal 122 changes according to the magnitude of the measurement value 111. Accordingly, the fan 2 can momentarily adjust the rotation speed in response to the ambient temperature.

Specifically, when the ambient temperature is higher than a temperature $T_1$ and lower than a temperature $T_2$, the driving chip 12 adjusts the voltage value of the driving signal 122 or the width ratio between the voltage pulses according to the measurement value 111, such that the rotation speed of the fan 2 can be adjusted according to the temperature variation.

When the ambient temperature is higher than the temperature $T_2$, the driving chip 12 holds the voltage value of the driving signal 122 or the width ratio between the voltage pulses of the driving signal 122, which is not adjusted with the variation of the measurement value 111. As a result, the rotation speed of the fan 2 cannot be increased with the rising temperature when the fan 2 works at the full speed.

When the ambient temperature is lower than the temperature $T_1$, the driving chip 12 generates the driving signal 122 according to the threshold revolution signal 121. The voltage value of the driving signal 122 or the width ratio between the voltage pulses of the driving signal 122 is not adjusted with the variation of the measurement value 111. Thus, the rotation speed of the fan 2 cannot be decreased with the dropping temperature when the fan 2 works at the low speed.

However, the conventional fan control device and method only can adjust the rotation speed of the fan with the variation of the temperature. In other words, the user cannot decrease the rotation speed of the fan leading to the noise of the fan, and cannot adjust the rotation speed of the fan according to the heat dissipating or airflow condition. That is, the conventional fan control device and method only can adjust the rotation speed of the fan according to the temperature variation. A fixed relationship between the rotation speed of the fan and the temperature is held, so the characteristic curve of the rotation speed of the fan versus the temperature cannot be further changed. Hence, the fan working at a fixed temperature has only one fixed rotation speed, and the rotation speed of the fan cannot be adjusted according to the user's requirement or the environmental condition at the fixed temperature.

Therefore, it is an important subject of the invention to provide a fan control device and a fan control method, which can automatically adjust the rotation speed of the fan according to the temperature as well as the user's setting. Thus, the rotation speed of the fan at various temperatures can be increased or decreased according to the user's requirement or the environmental condition such that the characteristic curve of the rotation speed of the fan versus the temperature can be further changed.

SUMMARY OF THE INVENTION

In view of the foregoing, the invention is to provide a fan control device and a fan control method capable of automatically adjusting a fan rotation speed.

To achieve the above, the fan control device of the invention receives a target revolution signal to control a rotation speed of a fan. The device includes a temperature measuring module, a revolution modulating module and a driving module. The temperature measuring module measures an ambient temperature of the fan and generates a temperature value according to the ambient temperature. The revolution modulating module electrically connected with the temperature measuring module receives the temperature value, and generates a control signal according to the temperature value and the target revolution signal. The driving module electrically connected with the revolution modulating module generates a driving signal to drive the fan accordingly.

In addition, the invention also discloses a fan control method, which receives a target revolution signal to control a rotation speed of a fan. The method includes the steps of measuring an ambient temperature of the fan and generating a temperature value according to the ambient temperature, generating a control signal according to the temperature value and the target revolution signal, and generating a driving signal to drive the fan according to the control signal.

As mentioned above, because the fan control device of the invention has the revolution modulating module for controlling the rotation speed of the fan according to the temperature value and the target revolution signal, the fan rotation speed is automatically adjusted according to the temperature value as well as the target revolution signal. Therefore, the characteristic curve of the fan rotation speed versus the temperature can be further diversified. Thus, the fan can properly adjust the fan rotation speed to satisfy the user's demands and environmental condition.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
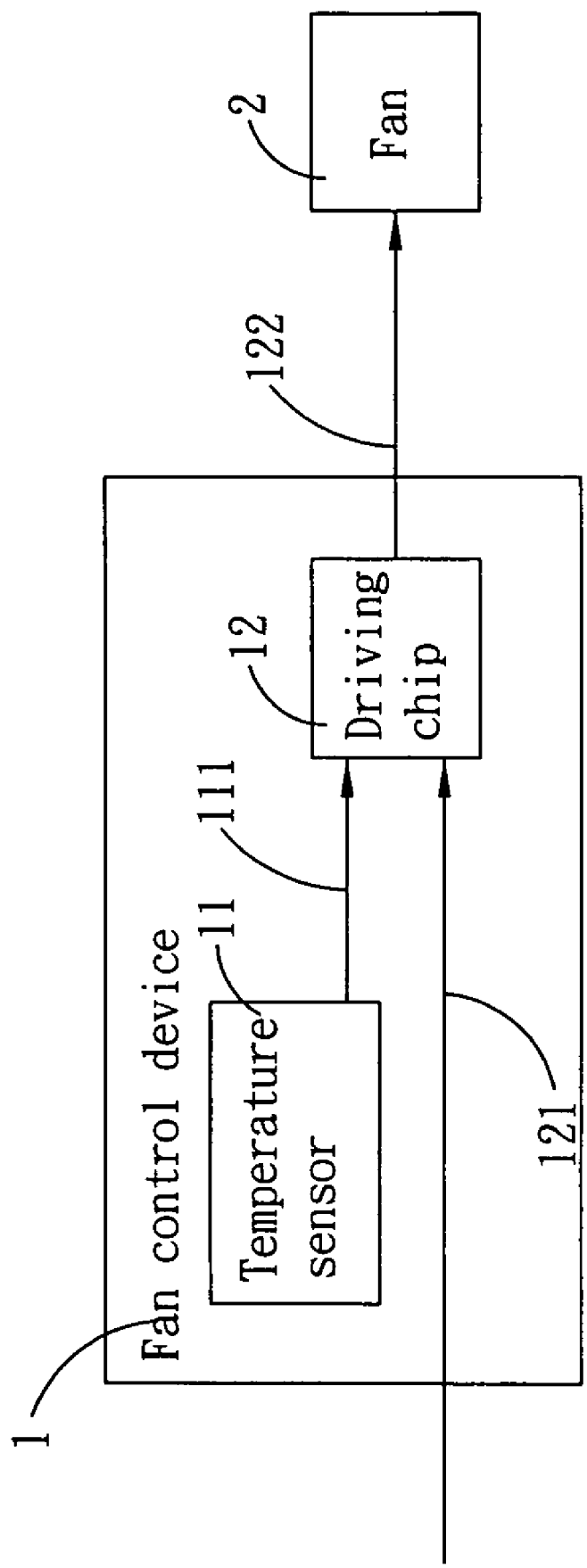
FIG. 1 is a schematic illustration showing the conventional fan control device.
Figure 2:
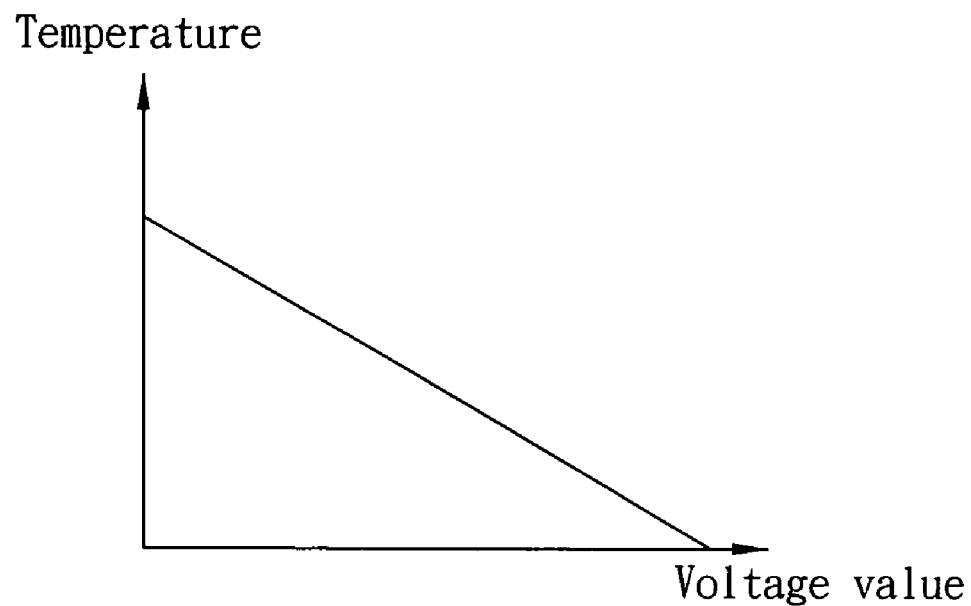
FIG. 2 shows a relationship curve of an ambient temperature versus a temperature sensor output signal according to the conventional fan control device.
Figure 3:
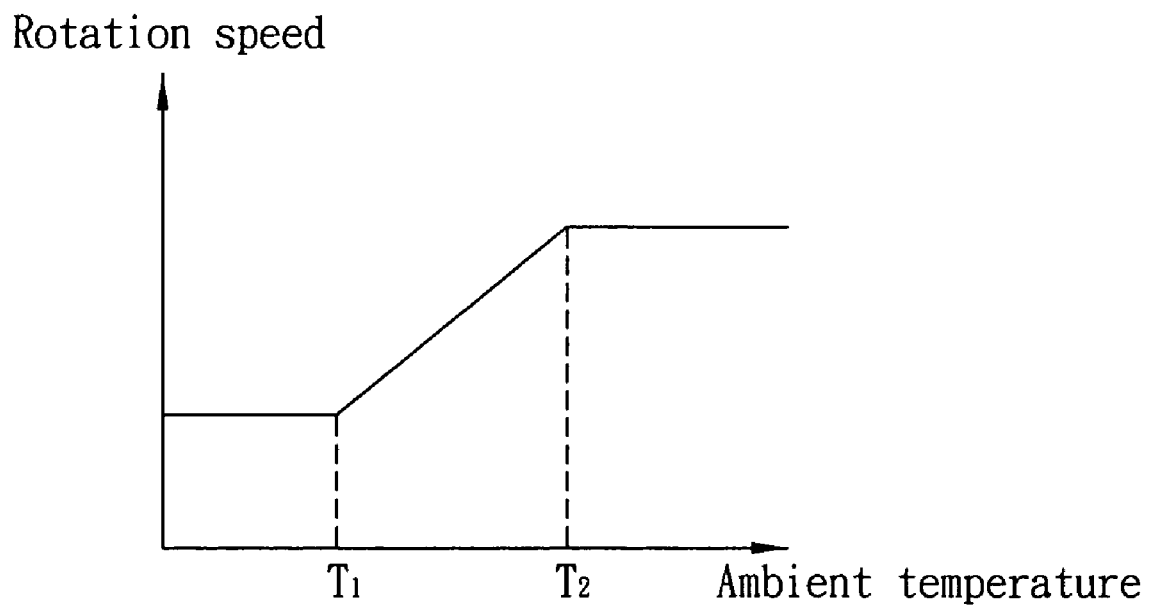
FIG. 3 shows a relationship curve of a rotation speed of a fan versus an ambient temperature according to the conventional fan control device.
Figure 4:
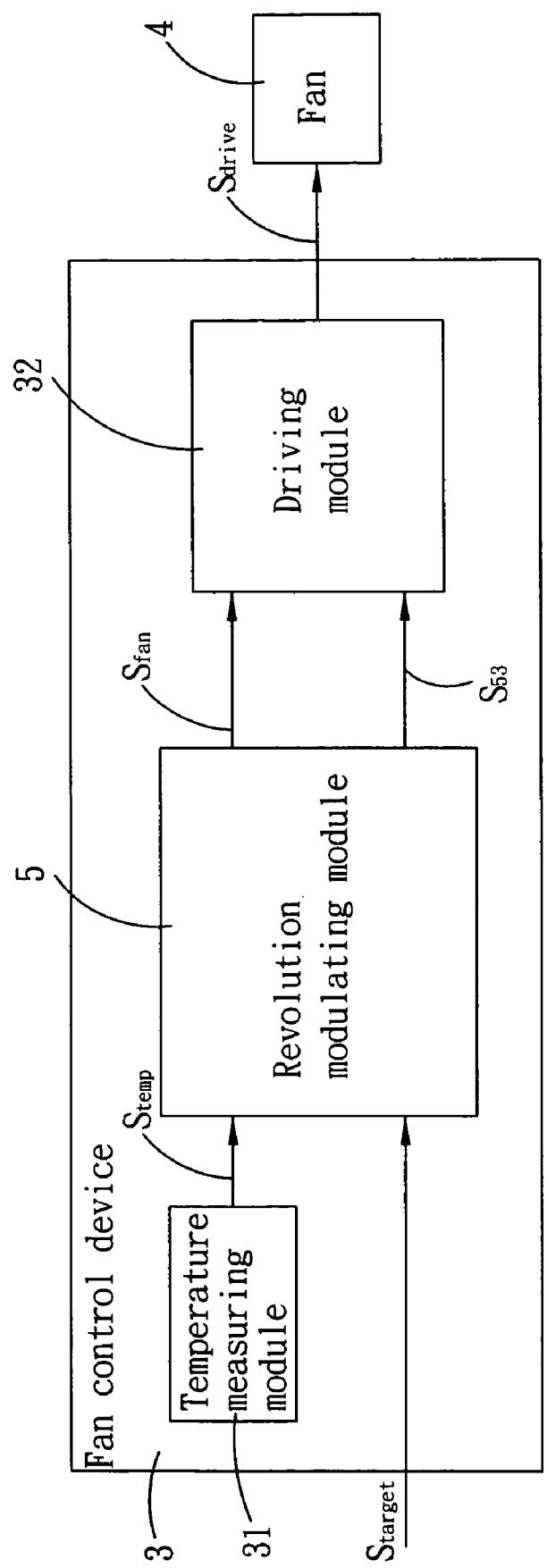
FIG. 4 is a schematic illustration showing a fan control device according to a preferred embodiment of the invention.

With reference to FIG. 4, a fan control device 3 according to a preferred embodiment of the invention receives a target revolution signal $S_{target}$ for controlling a rotation speed of a fan 4. The fan control device 3 includes a temperature measuring module 31, a revolution modulating module 5 and a driving module 32.

The temperature measuring module 31 measures an ambient temperature of the fan 4 and generates a temperature value $S_{temp}$ according to the ambient temperature. The revolution modulating module 5 electrically connected with the temperature measuring module 31 receives the temperature value $S_{temp}$, and generates a control signal $S_{fan}$ according to the temperature value $S_{temp}$ and the target revolution signal $S_{target}$. The driving module 32 electrically connected with the revolution modulating module 5 generates a driving signal $S_{drive}$ according to the control signal $S_{fan}$ for driving the fan 4. In this embodiment, the target revolution signal $S_{target}$ and the driving signal $S_{drive}$ can be pulse width modulation signals. The target revolution signal $S_{target}$ can be generated by a temperature control element, which generates a digital output, such as a temperature monitor chip, a PWM control chip, or a micro-processor on a main board.

Figure 5:
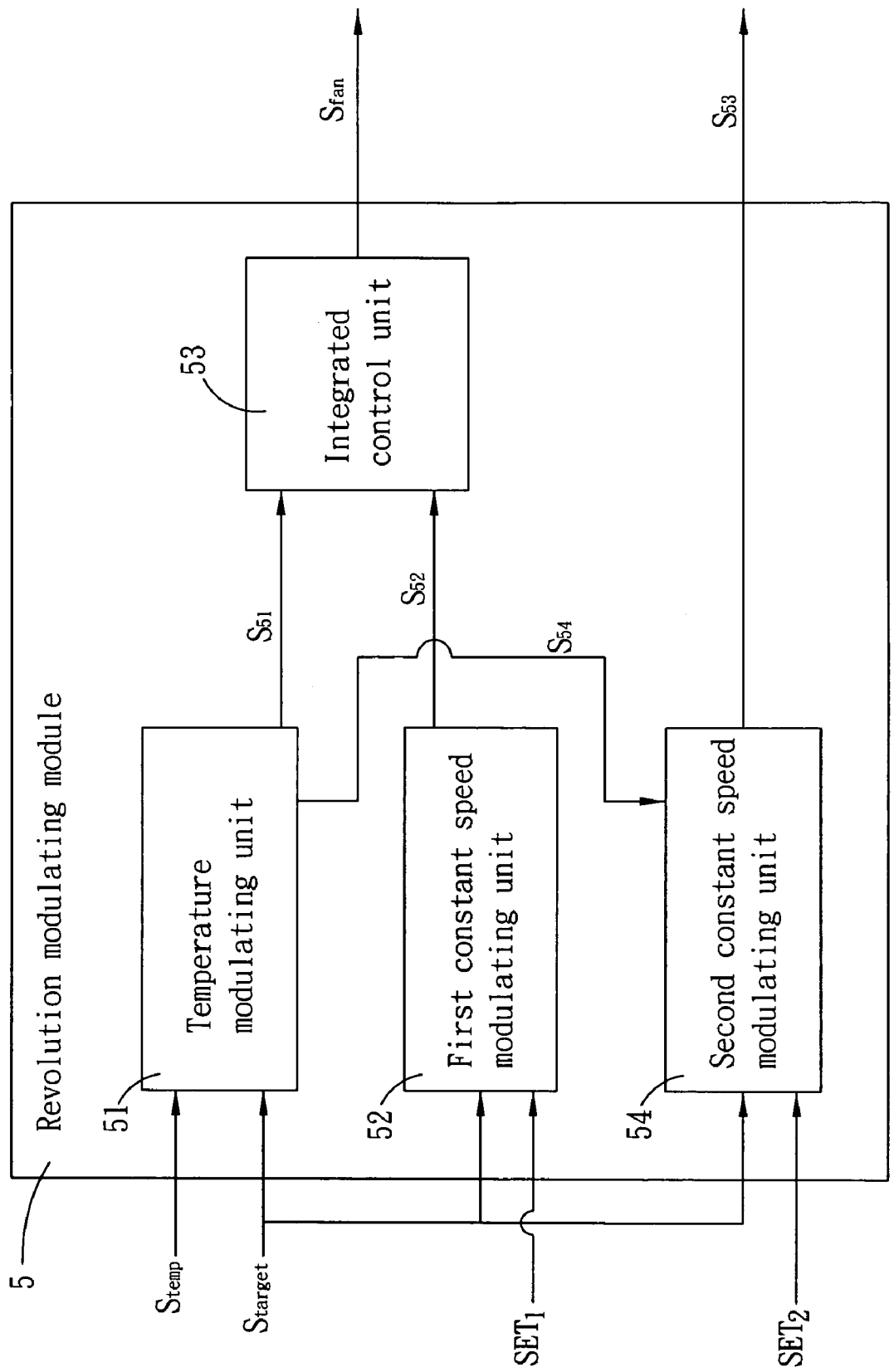
FIG. 5 is a schematic illustration showing a revolution modulating module of the fan control device according to the preferred embodiment of the invention.

As shown in FIG. 5, the revolution modulating module 5 of this embodiment includes a temperature modulating unit 51, a first constant speed modulating unit 52 and an integrated control unit 53.

The temperature modulating unit 51 receives the temperature value $S_{temp}$ and generates a temperature revolution signal $S_{51}$ according to the temperature value $S_{temp}$ and the target revolution signal $S_{target}$. The first constant speed modulating unit 52 generates a first speed limit signal $S_{52}$ according to the target revolution signal $S_{target}$. The integrated control unit 53 generates the control signal $S_{fan}$ according to at least one of the temperature revolution signal $S_{51}$ and the first speed limit signal $S_{52}$.

The first constant speed modulating unit 52 generates the first speed limit signal $S_{52}$ according to the target revolution signal $S_{target}$ and a first temperature setting $SET_1$. In this case, the first temperature setting $SET_1$ designates a temperature range for the fan 4 to keep rotating at a constant rotation speed.

In this embodiment, the revolution modulating module 5 further includes a second constant speed modulating unit 54, which generates a second speed limit signal $S_{53}$ according to a temperature speed limit signal $S_{54}$ and the target revolution signal $S_{target}$. The temperature speed limit signal $S_{54}$ is generated by the temperature modulating unit 51 according to the temperature value $S_{temp}$. The driving module 32 further generates the driving signal $S_{drive}$ according to the second speed limit signal $S_{53}$. The fan 4 keeps rotating at the constant rotation speed according to the driving signal $S_{drive}$.

In addition, the second constant speed modulating unit 54 further generates the second speed limit signal $S_{53}$ according to the target revolution signal $S_{target}$, the temperature speed limit signal $S_{54}$ and a second temperature setting $SET_2$. In the embodiment, the second temperature setting $SET_2$ designates a temperature range for the fan 4 to keep rotating at the constant rotation speed.

Figure 6:
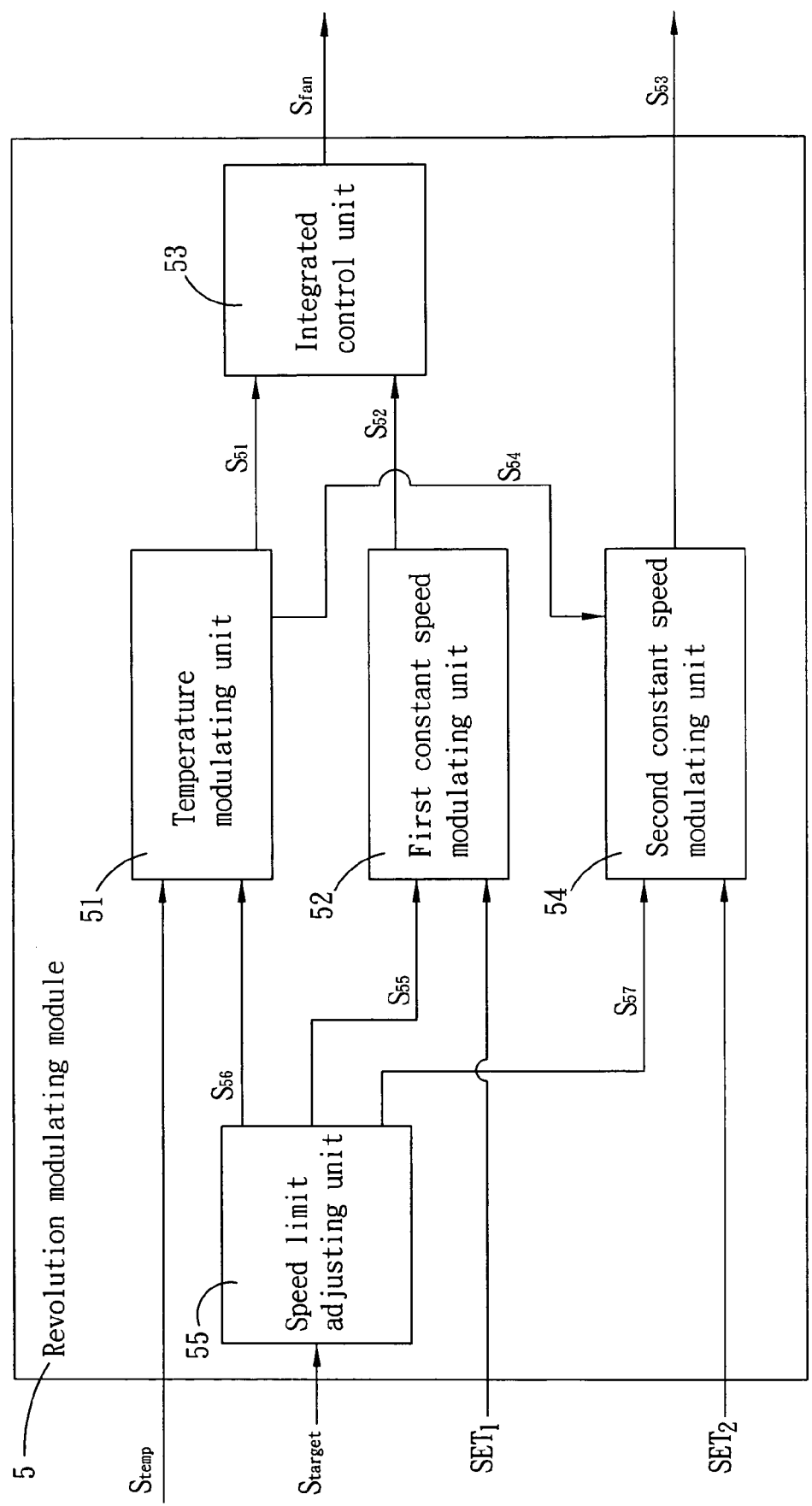
FIG. 6 is a schematic illustration showing a speed limit adjusting unit of the fan control device according to the preferred embodiment of the invention.

Referring to FIG. 6, the revolution modulating module 5 of this embodiment further includes a speed limit adjusting unit 55, which adjusts the target revolution signal $S_{target}$ to generate a first target signal $S_{55}$, a second target signal $S_{56}$ and a third target signal $S_{57}$.

The first constant speed modulating unit 52 generates the first speed limit signal $S_{52}$ according to the first target signal $S_{55}$, the temperature modulating unit 51 generates the temperature revolution signal $S_{51}$ according to the temperature value $S_{temp}$ and the second target signal $S_{56}$. The second constant speed modulating unit 54 generates the second speed limit signal $S_{53}$ according to the third target signal $S_{57}$ and the temperature speed limit signal $S_{54}$.

Figure 7A:
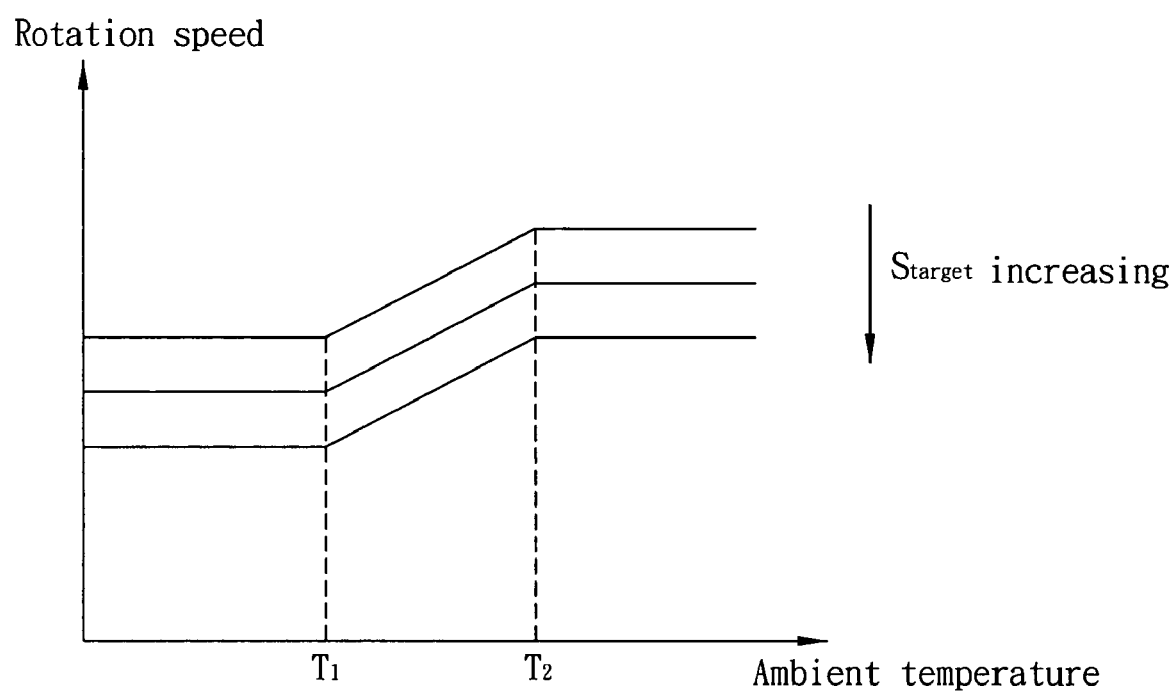
FIGS. 7A to 7G show relationship curves of the ambient temperature versus the rotation speed of the fan according to the fan control device of the preferred embodiment of the invention.
Figure 7B:
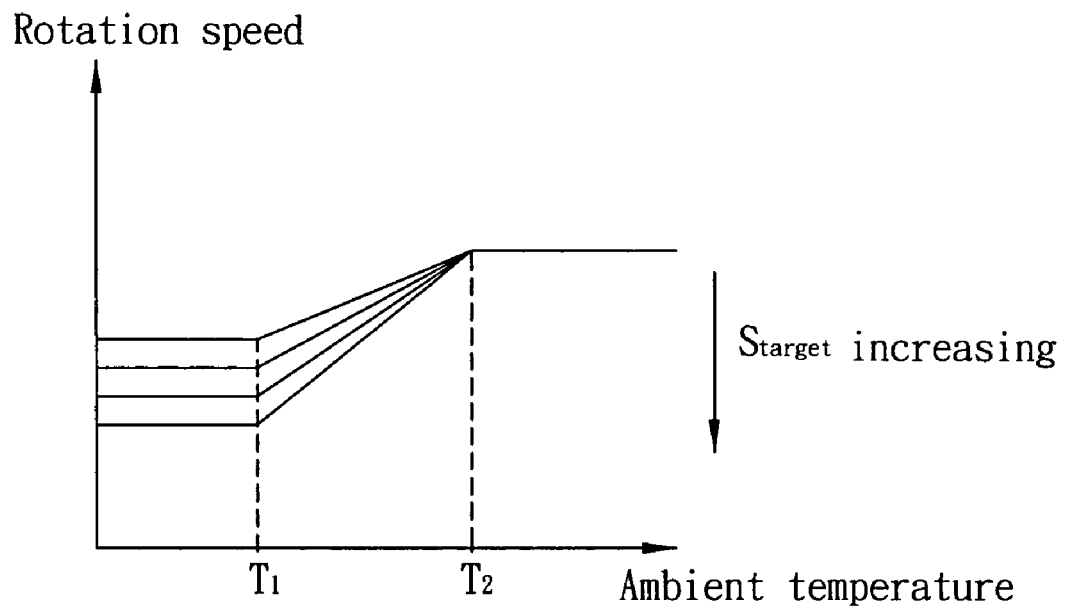
Figure 7C:
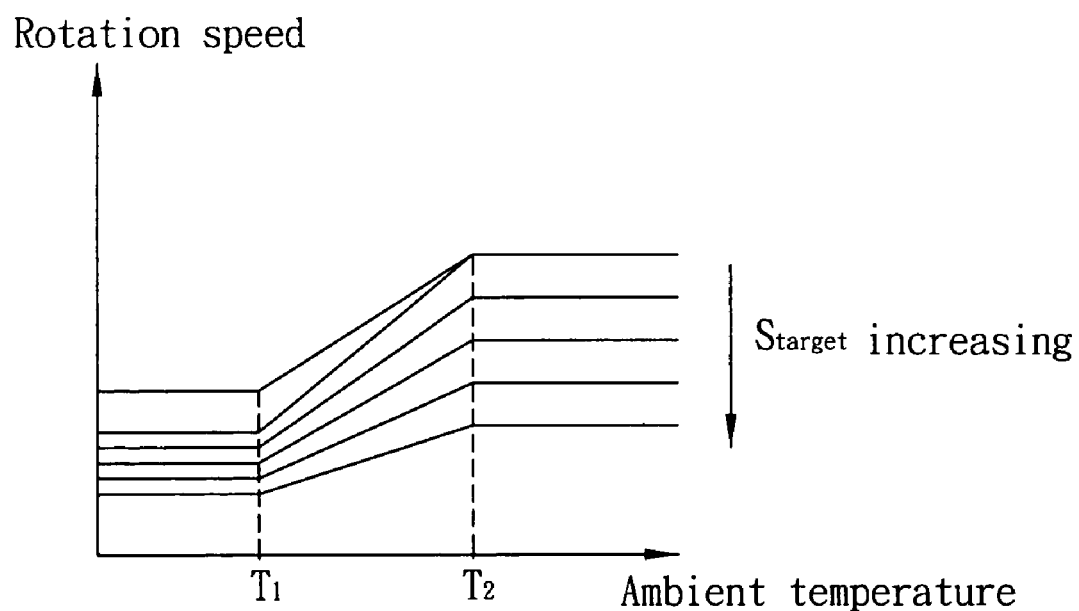
Figure 7D:
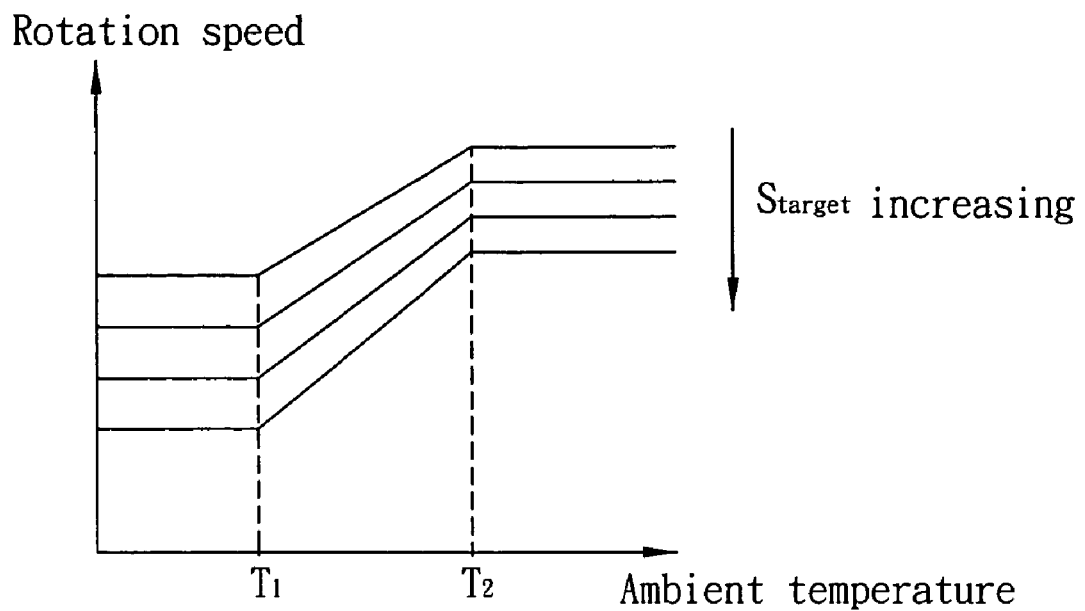
Figure 7E:
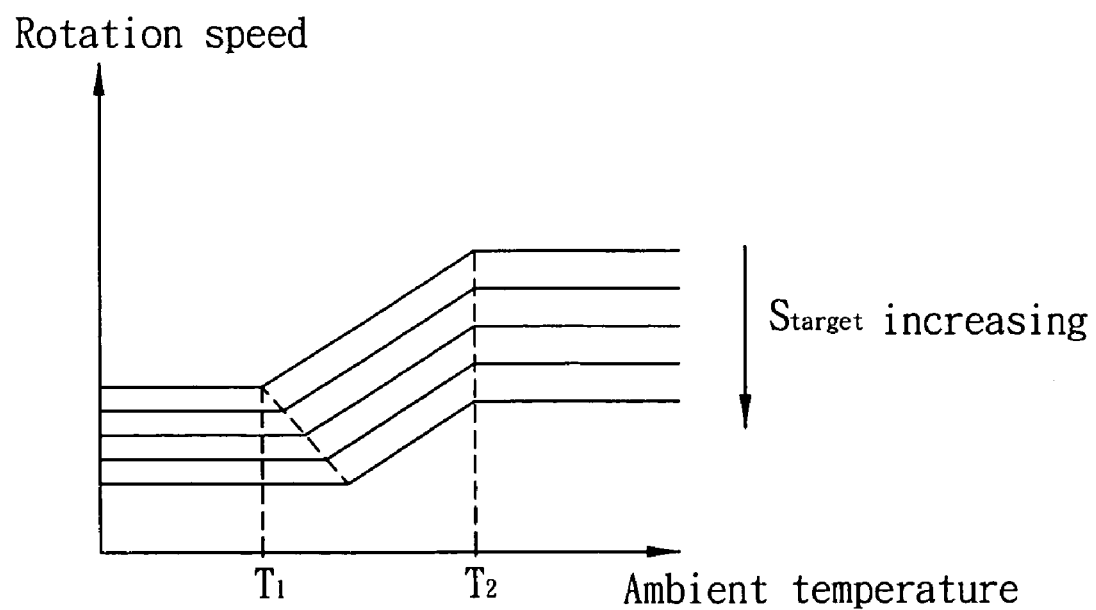
Figure 7F:
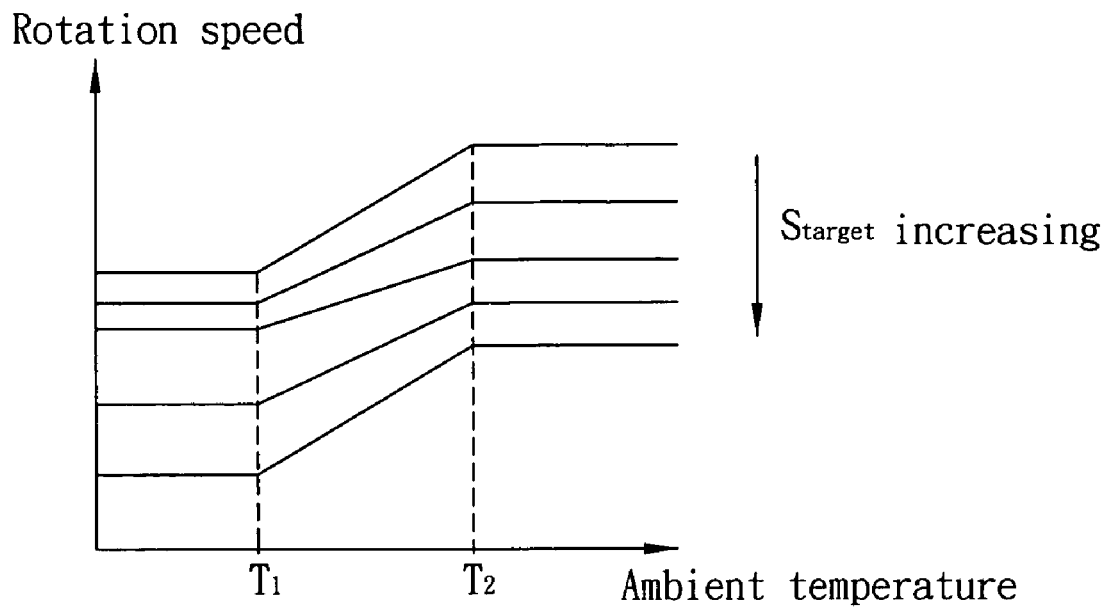

As shown in FIGS. 4, 5 and 7A, when the ambient temperature of the fan 4 in this embodiment is higher than a temperature $T_1$ and lower than a temperature $T_2$, the temperature modulating unit 51 generates the temperature revolution signal $S_{51}$ according to the temperature value $S_{temp}$, the integrated control unit 53 generates the control signal $S_{fan}$ according to the temperature revolution signal $S_{51}$ and the first speed limit signal $S_{52}$, and the driving module 32 generates the driving signal $S_{drive}$, according to the control signal $S_{fan}$. After being driven by the driving signal $S_{drive}$, the fan 4 can adjust its rotation speed according to the variation of the ambient temperature, or adjust its rotation speed under the same ambient temperature according to the target revolution signal $S_{target}$. In this embodiment, the rotation speed of the fan 4 gets higher as the voltage value of the target revolution signal $S_{target}$ gets smaller. That is, the rotation speed of the fan 4 decreases if the voltage of the target revolution signal $S_{target}$ increases under the constant ambient temperature.

When the ambient temperature is higher than the temperature $T_2$, the first constant speed modulating unit 52 generates the first speed limit signal $S_{52}$ according to the target revolution signal $S_{target}$ and the first temperature setting $SET_1$ which designates the fan 4 to keep rotating at a full speed when the ambient temperature is higher than the temperature $T_1$. The integrated control unit 53 generates the control signal $S_{fan}$ according to the first speed limit signal $S_{52}$. The driving module 32 generates the driving signal $S_{drive}$ according to the control signal $S_{fan}$. After being driven by the driving signal $S_{drive}$, the fan 4 rotates at the full speed and the rotation speed of the fan 4 does not increase with the increase of the temperature, and the rotation speed of the fan at the full speed under the same ambient temperature can be adjusted according to the target revolution signal $S_{target}$. That is, the rotation speed of the fan 4 decreases if the voltage of the target revolution signal $S_{target}$ increases under the constant ambient temperature.

When the ambient temperature is lower than the temperature $T_1$, the second constant speed modulating unit 54 generates the second speed limit signal $S_{53}$ according to the target revolution signal $S_{target}$, the temperature speed limit signal $S_{54}$ and the second temperature setting $SET_2$, such that the rotation speed of the fan 4 does not sharply increase or decrease near the temperature $T_1$. The second temperature setting $SET_2$ designates the fan 4 to keep rotating at a low speed when the ambient temperature is lower than the temperature $T_1$. At this time, if the voltage level of the second speed limit signal $S_{53}$ is smaller than that of the control signal $S_{fan}$, the driving module 32 generates the driving signal $S_{drive}$ according to the second speed limit signal $S_{53}$, the fan 4 keeps rotating at the low speed according to the driving signal $S_{drive}$, and the rotation speed of the fan 4 does not decrease with the decrease of the temperature. The rotation speed of the fan 4 at the speed under the same ambient temperature is adjusted according to the target revolution signal $S_{target}$. That is, the rotation speed of the fan 4 decreases if the voltage of the target revolution signal $S_{target}$ increases under the same ambient temperature.

In this embodiment, the revolution modulating module 5 can be a program code to be executed in a microcontroller, a microprocessor, a digital signal processor, or the like to control the driving module 32 and the fan 4 by means of firmware. In this case, the first temperature setting $SET_1$ and the second temperature setting $SET_2$ are parameters or variables in the program code. On the other hand, the revolution modulating module 5 is directly composed of an electric circuit for controlling the driving module 32 and the fan 4 by means of hardware, wherein the first temperature setting $SET_1$ and the second temperature setting $SET_2$ are characteristic parameters of an electrical element such as a capacitor, a resistor, an inductor or a transistor in an electric circuit.

As shown in FIGS. 4, 5, and 7B to 7F, adjusting the first temperature setting $SET_1$ and the second temperature setting $SET_2$ can change the control property of the revolution modulating module 5, such that not only the rotation speed of the fan 4 continuously changes under various temperatures, but the relationship between the rotation speed of the fan 4 and the ambient temperature is diversified.

Figure 7G:
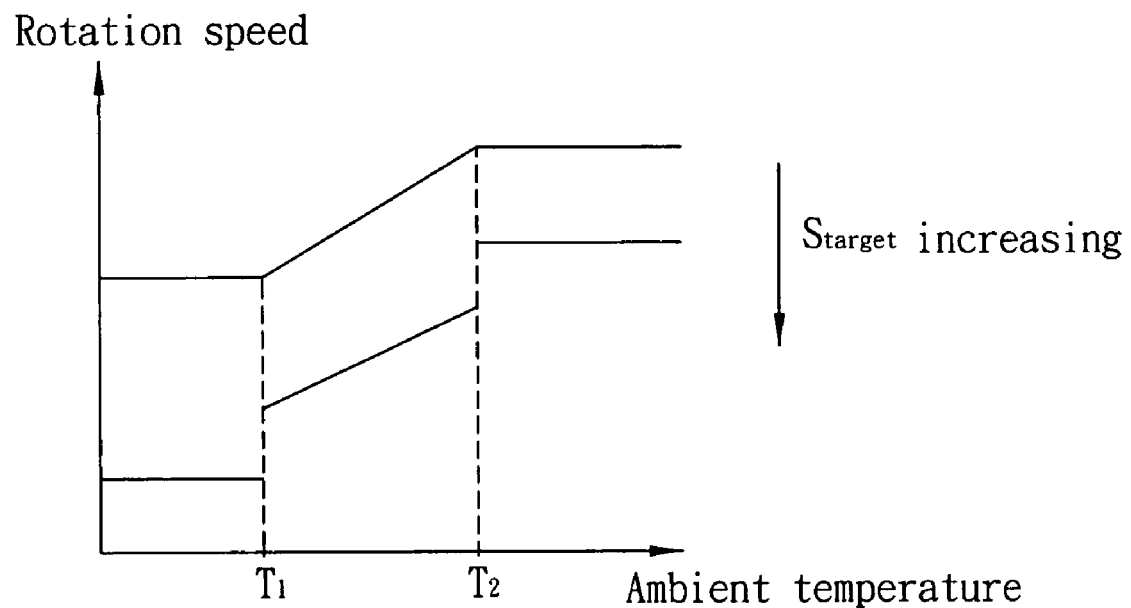

As shown in FIGS. 4, 6 and 7G, the control property of the revolution modulating module 5 is changed according to the first temperature setting $SET_1$ and the second temperature setting $SET_2$ as well as the speed limit adjusting unit 55 which generates the first target signal $S_{55}$, the second target signal $S_{56}$ and the third target signal $S_{57}$ of different values, such that the first speed limit signal $S_{52}$, the temperature revolution signal $S_{51}$ and the second speed limit signal $S_{53}$ are generated respectively according to the first target signal $S_{55}$, the second target signal $S_{56}$ and the third target signal $S_{57}$, and the rotation speed of the fan 4 is thus discontinuously changed from the temperature $T_1$ to the temperature $T_2$. Hence, the relationship between the rotation speed of the fan 4 and the ambient temperature is diversified.

Figure 8:
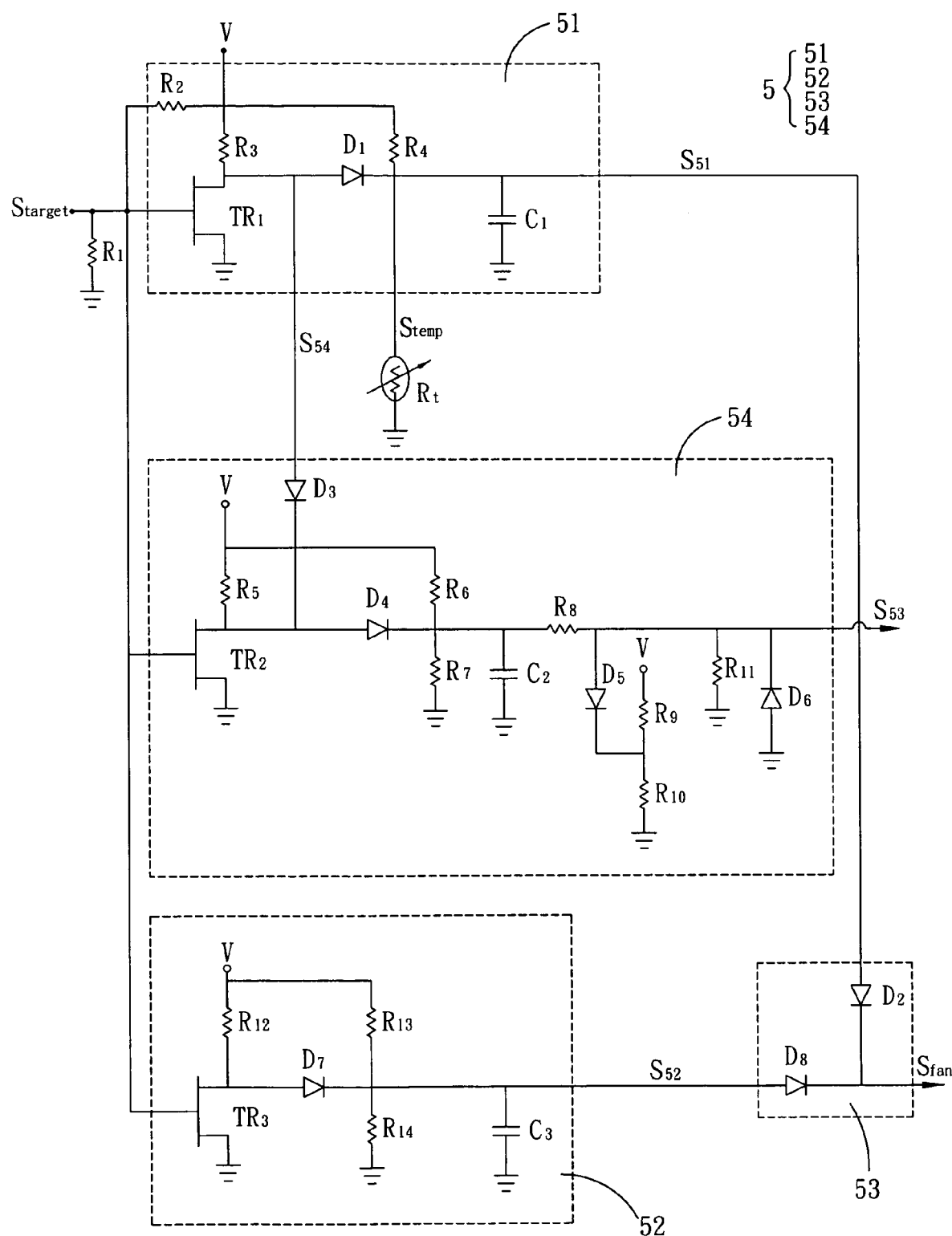
FIG. 8 is a schematic illustration showing a circuit of the fan control device according to another preferred embodiment of the invention.

As shown in FIG. 8, the revolution modulating module 5 in this embodiment is directly composed of an electric circuit. The target revolution signal $S_{target}$ is inputted to the revolution modulating module 5 and then grounded through a resistor $R_1$, or respectively inputted to the temperature modulating unit 51, the second constant speed modulating unit 54 and the first constant speed modulating unit 52.

The temperature modulating unit 51 includes a plurality of resistors $R_2$ to $R_4$, a diode $D_1$, a capacitor $C_1$ and a transistor $TR_1$. The transistor $TR_1$ includes a gate, a first electrode and a second electrode. The target revolution signal $S_{target}$ is inputted to the gate of the transistor $TR_1$, and the electrode of the transistor $TR_1$ is grounded, and an external power V is inputted to the resistors $R_2$ to $R_4$. The resistor $R_2$ is electrically connected with the gate of the transistor $TR_1$, and the resistor $R_3$ and the diode $D_1$ are electrically connected with the second electrode of the transistor $TR_1$.

The temperature measuring module 31 can be a thermister $R_t$, which generates the temperature value $S_{temp}$ and is electrically connected with the diode $D_1$, the capacitor $C_1$ and the resistor $R_4$ to generate the temperature revolution signal $S_{51}$.

The second constant speed modulating unit 54 includes a plurality of resistors $R_5$ to $R_{11}$, a plurality of diodes $D_3$ to $D_6$, a capacitor $C_2$ and a transistor $TR_2$. The transistor $TR_2$ includes a gate, a first electrode and a second electrode. The target revolution signal $S_{target}$ is inputted to the gate of the transistor $TR_2$, and the first electrode of the transistor $TR_1$ is grounded. The external power V is inputted to the resistors $R_5$ to $R_6$. The diode $D_3$ is electrically connected with the temperature modulating unit 51 to receive the temperature speed limit signal $S_{54}$. The resistor $R_5$, the diode $D_3$ and the diode $D_4$ are electrically connected with the second electrode of the transistor $TR_2$. The resistor $R_7$ and the capacitor $C_2$ are connected in parallel and electrically connected with the resistor $R_6$, the resistor $R_8$ and the diode $D_4$. This circuit controls the rotation speed of the fan 4 at the temperature $T_1$ and prevents the rotation speed of the fan 4 from suddenly increasing or decreasing.

The resistor $R_8$ is electrically connected with the diode $D_5$, the diode $D_6$ and the resistor $R_{11}$. The external power V is inputted to the resistor $R_9$, and the resistor $R_9$ is electrically connected with the diode $D_5$ and the resistor $R_{10}$ to generate the second speed limit signal $S_{53}$.

The first constant speed modulating unit 52 includes a plurality of resistors $R_{12}$ to $R_{14}$, a diode $D_7$, a capacitor $C_3$ and a transistor $TR_3$. The transistor $TR_3$ includes a gate, a first Electrode and a second electrode. The target revolution signal $S_{target}$ is inputted to the gate of the transistor $TR_3$, and the first electrode of the transistor $TR_3$ is grounded, and the external power V is inputted to the resistor $R_{12}$ and the resistor $R_{13}$. The resistor $R_{12}$ is electrically connected with the second electrode of the transistor $TR_3$, and the resistor $R_{13}$ and the diode $D_7$ are electrically connected with the second electrode of the transistor $TR_3$. The resistor $R_{14}$ and the capacitor $C_3$ are connected in parallel and electrically connected with the resistor $R_{13}$ and the diode $D_7$ to generate the first speed limit signal $S_{52}$.

The integrated control unit 53 includes diodes $D_2$ and $D_8$. The first speed limit signal $S_{52}$ is inputted to the diode $D_8$, and the temperature revolution signal $S_{51}$ is inputted to the diode $D_2$. The diode $D_2$ is electrically connected with the diode $D_8$ to generate the control signal $S_{fan}$.

Figure 9:
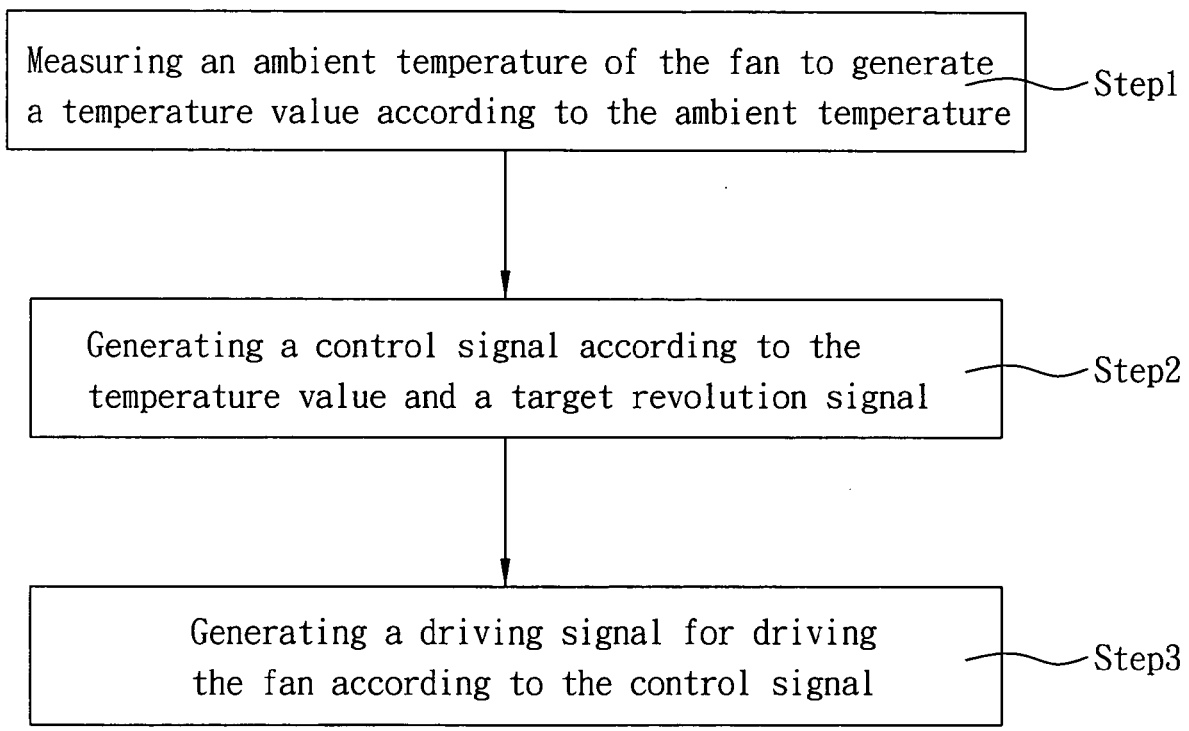
FIG. 9 is a flow chart showing a fan control method according to a preferred embodiment of the invention.

As shown in FIG. 9, a fan control method of the invention receives a target revolution signal to control a rotation speed of a fan, and the method includes steps Step1 to Step3.

In step Step1, an ambient temperature of the fan is measured and a temperature value is generated according to the ambient temperature.

In step Step2, a control signal is generated according to the temperature value and a target revolution signal.

In step Step3, a driving signal for driving the fan is generated according to the control signal.

Figure 10:
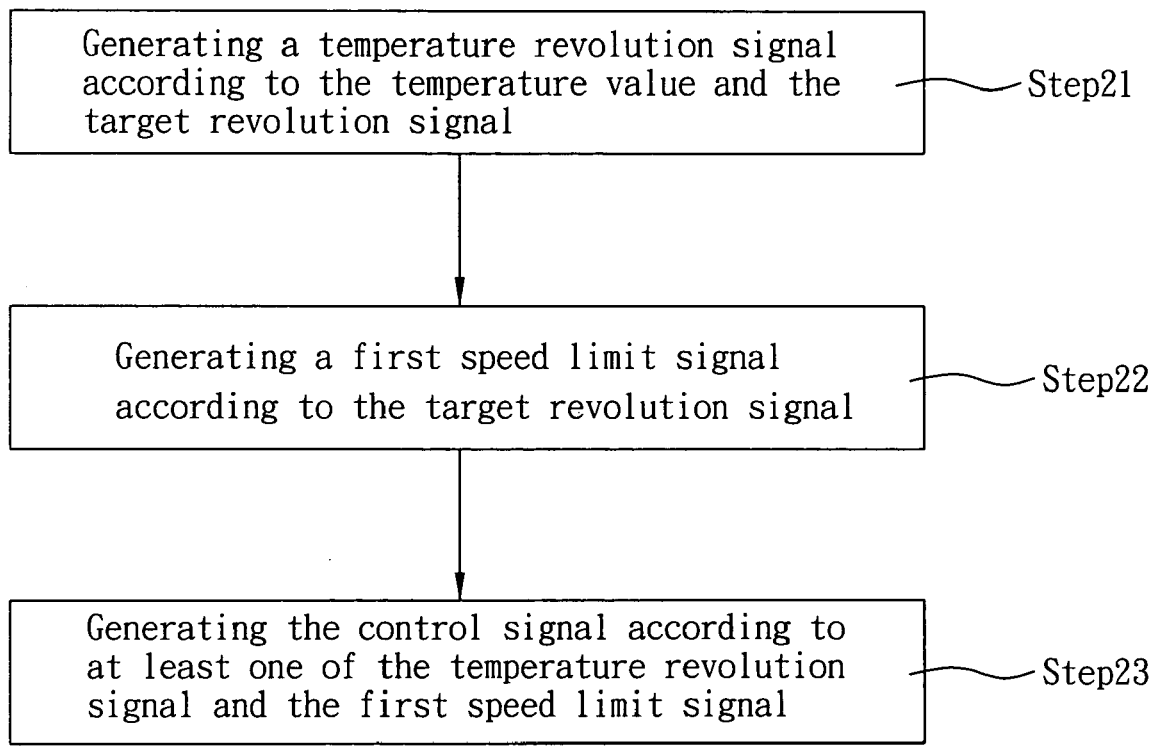
FIG. 10 is a flow chart showing a fan control method according to the preferred embodiment of the invention, wherein the step of generating a control signal according to a temperature value and a target revolution signal is illustrated.

As shown in FIG. 10, step Step2 of this embodiment includes steps Step21 to Step23.

In step Step21, a temperature revolution signal is generated according to the temperature value and the target revolution signal.

In step Step22, a first speed limit signal is generated according to the target revolution signal. In this step, it is also possible to generate the first speed limit signal according to the target revolution signal and a first temperature setting. Herein, the first temperature setting designates a temperature range for the fan to keep rotating at a constant rotation speed.

In step Step23, the control signal is generated according to at least one of the temperature revolution signal and the first speed limit signal.

Figure 11:
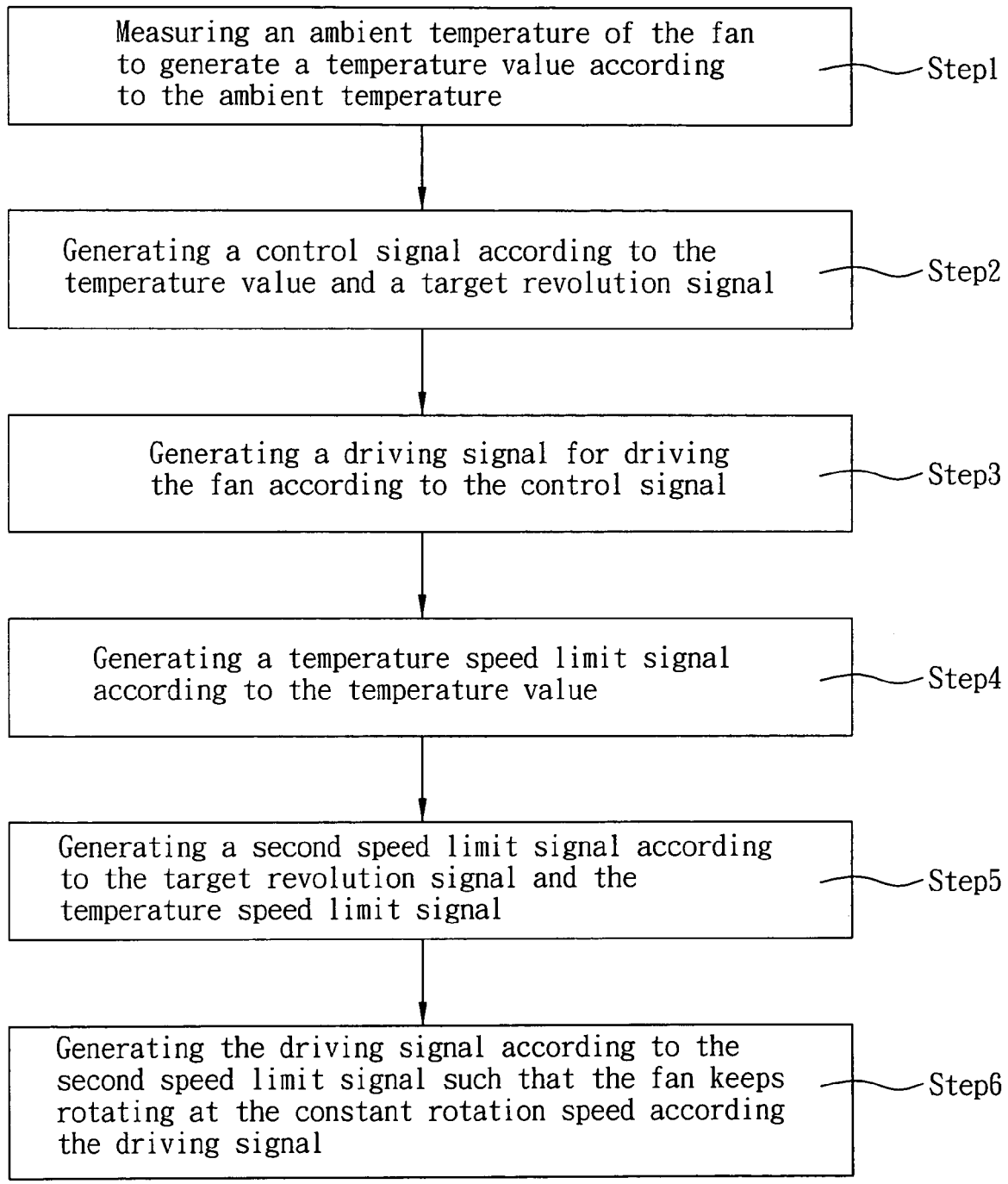
FIG. 11 is a flow chart showing a fan control method according to the preferred embodiment of the invention, wherein the step of generating a second speed limit signal according to the target revolution signal and a temperature revolution signal is illustrated.

As shown in FIG. 11, what is different from the FIG. 9 is that the fan control method of this embodiment further includes steps Step4 to Step6.

In step Step4, a temperature speed limit signal is generated according to the temperature value.

In step Step5, a second speed limit signal is generated according to the target revolution signal and the temperature speed limit signal. In this step, it is also possible to generate the second speed limit signal according to the target revolution signal, the temperature speed limit signal and a second temperature setting. Herein, the second temperature setting designates a temperature range for the fan to keep rotating at a constant rotation speed.

In step Step6, the driving signal is generated according to the second speed limit signal, and the fan keeps rotating at the constant rotation speed according to the driving signal.

In addition, a first target signal, a second target signal and a third target signal also can be generated according to the target revolution signal in another embodiment. Step Step22 generates the first speed limit signal according to the first target signal, step Step21 generates the temperature revolution signal according to the temperature value and the second target signal, and step Step4 generates the second speed limit signal according to the third target signal and the temperature speed limit signal.

The fan control method of this embodiment is applied to the fan control device according to the embodiment of FIGS. 4 to 8, so the fan control method has been discussed in the embodiment of the fan control device, and detailed descriptions thereof will be omitted.

In summary, since the fan control device of the invention has the revolution modulating module for controlling the rotation speed of the fan according to the temperature value and the target revolution signal, the fan rotation speed is automatically adjusted according to the temperature value as well as the target revolution signal. Therefore, the characteristic curve of the fan rotation speed versus the temperature can be further diversified. Thus, the fan rotation speed can be properly adjusted to satisfy the user's demands and the environmental condition.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A fan control device, which receives a target revolution signal to control a rotation speed of a fan, comprising:
   a temperature measuring module measuring an ambient temperature of the fan to generate a temperature value;
   a revolution modulating module electrically connected with the temperature measuring module, receiving the temperature value and generating a control signal according to the temperature value and the target revolution signal; and
   a driving module electrically connected with the revolution modulating module and generating a driving signal according to the control signal to drive the fan, wherein the revolution modulating module comprises:
   a temperature modulating unit for receiving the temperature value and generating a temperature revolution signal according to the temperature value and the target revolution signal;
   a first constant speed modulating unit for generating a first speed limit signal according to the target revolution signal;
   an integrated control unit for generating the control signal according to at least one of the temperature revolution signal and the first speed limit signal; and
   a second constant speed modulating unit for generating a second speed limit signal according to the target revolution signal and a temperature speed limit signal, wherein the temperature speed limit signal is generated by the temperature modulating unit according to the temperature value.

2. The fan control device according to claim 1, wherein the target revolution signal and the driving signal are pulse width modulation signals, respectively.

3. The fan control device according to claim 1, wherein the first constant speed modulating unit generates the first speed limit signal according to a first temperature setting designating a temperature range for the fan to keep rotating at a constant rotation speed.

4. The fan control device according to claim 1, wherein the second constant speed modulating unit generates the second speed limit signal according to a second temperature setting designating a temperature range for the fan to keep rotating at a constant rotation speed, and the driving module generates the driving signal according to the second speed limit signal to keep the fan rotating at a constant rotation speed.

5. The fan control device according to claim 1, wherein the revolution modulating module further comprises:
   a speed limit adjusting unit for adjusting the target revolution signal to generate a first target signal, a second target signal and a third target signal, wherein the first constant speed modulating unit generates the first speed limit signal according to the first target signal, the temperature modulating unit generates the temperature revolution signal according to the temperature value and the second target signal, and the second constant speed modulating unit generates the second speed limit signal according to the third target signal and the temperature speed limit signal.

6. The fan control device according to claim 1, wherein the second constant speed modulating unit comprises:
   a first resistor;
   a transistor having a gate, a first electrode and a second electrode, wherein the gate of the transistor receives the target revolution signal, and the first electrode of the transistor is grounded;
   a second resistor having a first end electrically connected with a first end of the first resistor, and a second end electrically connected with the second electrode of the transistor;
   a first diode having a first end electrically connected with the second electrode of the transistor, and a second end electrically connected with the temperature modulating unit to receive the temperature speed limit signal;
   a second diode having a first end electrically connected with the second electrode of the transistor, and a second end electrically connected with a second end of the first resistor;
   a third resistor having a first end electrically connected with the second end of the first resistor;
   a capacitor having a first end electrically connected with the second end of the first resistor and connected in parallel with the third resistor; and a fourth resistor having a first end electrically connected with the first resistor and the capacitor, and a second end electrically connected with the driving module to generate the second speed limit signal.

7. The fan control device according to claim 6, wherein the second constant speed modulating unit further comprises:
 a third diode having a first end electrically connected with the fourth resistor;
 a fourth diode having a first end electrically connected with the fourth resistor, and a second end that is grounded; and
 a fifth resistor electrically connected with a second end of the third diode.

8. The fan control device according to claim 1, wherein the temperature modulating unit comprises:
 a first resistor;
 a transistor having a gate, a first electrode and a second electrode, wherein the gate of the transistor receives the target revolution signal, and the first electrode of the transistor is grounded;
 a second resistor having a first end electrically connected with a first end of the first resistor, and a second end electrically connected with the gate of the transistor;
 a third resistor having a first end electrically connected with the first end of the first resistor, and a second end electrically connected with the second electrode of the transistor;
 a diode having a first end electrically connected with the second electrode of the transistor, and a second end electrically connected with a second end of the first resistor; and
 a capacitor electrically connected with the second end of the first resistor and receiving the temperature value for generating the temperature revolution signal.

9. The fan control device according to claim 1, wherein the first constant speed modulating unit comprises:
 a first resistor;
 a transistor having a gate, a first electrode and a second electrode, wherein the gate of the transistor receives the target revolution signal, and the first electrode of the transistor is grounded;
 a second resistor having a first end electrically connected with a first end of the first resistor, and a second end electrically connected with the second electrode of the transistor;
 a diode having a first end electrically connected with the second electrode of the transistor, and a second end electrically connected with a second end of the first resistor;
 a third resistor having a first end electrically connected with the second end of the first resistor; and
 a capacitor electrically connected with the second end of the first resistor and connected in parallel with the third resistor for generating the first speed limit signal.

10. The fan control device according to claim 1, wherein the integrated control unit comprises:
 a first diode having a first end electrically connected with the temperature modulating unit to receive the temperature revolution signal; and
 a second diode having a first end electrically connected with the first constant speed modulating unit to receive the first speed limit signal, and a second end electrically connected with a second end of the first diode to generate the control signal.

11. The fan control device according to claim 1, wherein the revolution modulating module is a program code to be executed in a microprocessor, a microcontroller or a digital signal processor (DSP).

12. A fan control method, which receives a target revolution signal to control a rotation speed of a fan, the method comprising the steps of:
 measuring an ambient temperature of the fan so as to generate a temperature value;
 generating a temperature revolution signal according to the temperature value and the target revolution signal;
 generating a first speed limit signal according to the target revolution signal and a first temperature setting;
 generating a control signal according to at least one of the temperature revolution signal and the first speed limit signal;
 generating a temperature speed limit signal according to the temperature value;
 generating a second speed limit signal according to the target revolution signal and the temperature speed limit signal; and
 driving the fan by generating a driving signal according to the control signal and the second speed limit.

13. The fan control method according to claim 12, wherein the target revolution signal and the driving signal are pulse width modulation signals, respectively.

14. The fan control method according to claim 12, wherein the step of generating the first speed limit signal comprises:
 generating the first speed limit signal according to the target revolution signal and the first temperature setting which designates a temperature range for the fan to keep rotating at a constant rotation speed.

15. The fan control method according to claim 12, wherein the step of generating the driving signal is further according to the second speed limit signal to keep the fan rotating at a constant rotation speed accordingly.

16. The fan control method according to claim 12, wherein the step of generating the second speed limit signal comprises:
 generating the second speed limit signal according to the target revolution signal and a second temperature setting which designates a temperature range for the fan to keep rotating at a constant rotation speed.

17. The fan control method according to claim 12, wherein the step of generating the control signal according to the temperature value and the target revolution signal comprises:
 adjusting the target revolution signal to generate a first target signal, a second target signal and a third target signal;
 generating the first speed limit signal according to the first target signal;
 generating the temperature revolution signal according to the temperature value and the second target signal; and
 generating the second speed limit signal according to the third target signal and the temperature speed limit signal.

* * * * *